(12) United States Patent
Riley

(10) Patent No.: US 6,236,703 B1
(45) Date of Patent: May 22, 2001

(54) FRACTIONAL-N DIVIDER USING A DELTA-SIGMA MODULATOR

(75) Inventor: Thomas A. D. Riley, Osgoode (CA)

(73) Assignee: Philsar Semiconductor Inc., Ontario (CA)

(*) Notice: Subject to any disclaimer, the term of this patent is extended or adjusted under 35 U.S.C. 154(b) by 0 days.

(21) Appl. No.: 09/281,854

(22) Filed: Mar. 31, 1999

(30) Foreign Application Priority Data

Mar. 31, 1998 (CA) .................................................. 2233831

(51) Int. Cl.[7] .................................................. H03K 21/00
(52) U.S. Cl. .............................. 377/48; 331/1 A; 331/51
(58) Field of Search .............................. 377/48; 331/1 A, 331/51

(56) References Cited

U.S. PATENT DOCUMENTS

| | | | |
|---|---|---|---|
| 4,609,881 | 9/1986 | Wells | 331/1 A |
| 4,800,342 | 1/1989 | Jackson | 331/10 |
| 4,965,531 | 10/1990 | Riley | 331/1 |
| 5,038,117 | 8/1991 | Miller | 331/16 |
| 5,055,802 | 10/1991 | Hietala et al. | 331/16 |
| 5,068,661 | 11/1991 | Kaneaki et al. | 341/143 |
| 5,079,521 | 1/1992 | Gaskell et al. | 331/1 A |
| 5,166,642 | 11/1992 | Hietala | 331/1 A |
| 5,495,206 | 2/1996 | Hietala | 331/1 A |
| 5,563,535 | 10/1996 | Corry et al. | 327/105 |
| 5,574,455 | 11/1996 | Hori et al. | 341/144 |
| 5,646,621 | 7/1997 | Cabler et al. | 341/143 |
| 5,748,043 | 5/1998 | Koslov | 331/1 A |
| 5,777,521 | 7/1998 | Gillig et al. | 331/16 |

FOREIGN PATENT DOCUMENTS

| | | |
|---|---|---|
| 2003428 | 5/1991 | (CA) . |
| 2123477 | 5/1994 | (CA) . |
| 2189980 | 11/1995 | (CA) . |

OTHER PUBLICATIONS

James Crawford, "Frequency synthesizer design handbook", Artech House, pp346–351, 1994.*
Burr–Brown Appliation Bulletin, "A 'Getting Started' Guied for the $\Delta\Sigma$ Converters: ADS1210, ADS1211, ADS1212, ADS1213, ADS1214, ADS1215," Aug. 1997, pp. 1–7.
Burr–Brown, "Giving $\ominus\Sigma$ Converters a Little Gain Boost with a Front End Analog Gain Stage," Jan. 1997, pp. 1–3.
Burr–Brown Application Bulletin, "Programming Tricks for Higher Conversion Speeds Utilizing Delta Sigma Converters," Aug. 1997, pp. 1–6.
Burr–Brown Application Bulletin, "How to Get 23 Bits of Effective Resolution from Your 24–Bit Converter," Sep. 1997, pp. 1–6.
Norsworthy, et al., "Delta–Sigma Data Converters: Theory, Design. and Simulation," 1997, Chapters 1 and 2.
Philsar Electronics Inc. Product Specification Sheet, PS–XX00 Series V1.2 Preliminary, 1.2 to 6.5 Ghz/500 MHz Dual Synthesizers, Sep. 1998.

* cited by examiner

Primary Examiner—Margaret R. Wambach
(74) Attorney, Agent, or Firm—Thomas, Kayden, Horstemeyer & Riley, L.L.P.

(57) ABSTRACT

A delta-sigma modulator having a dead-zone quantizer and an error shaping digital filter clocked by a signal which is periodic at the frequency of the reference. A dead-zone quantizer provides quantization of a high resolution digital word to a low resolution digital word with three or a higher odd number of possible output levels and with an output of zero for an input near the center of the normal input range. The delta-sigma modulator is used in a fractional-N divider. The fractional-N divider is used in a fractional-N frequency synthesizer.

22 Claims, 4 Drawing Sheets

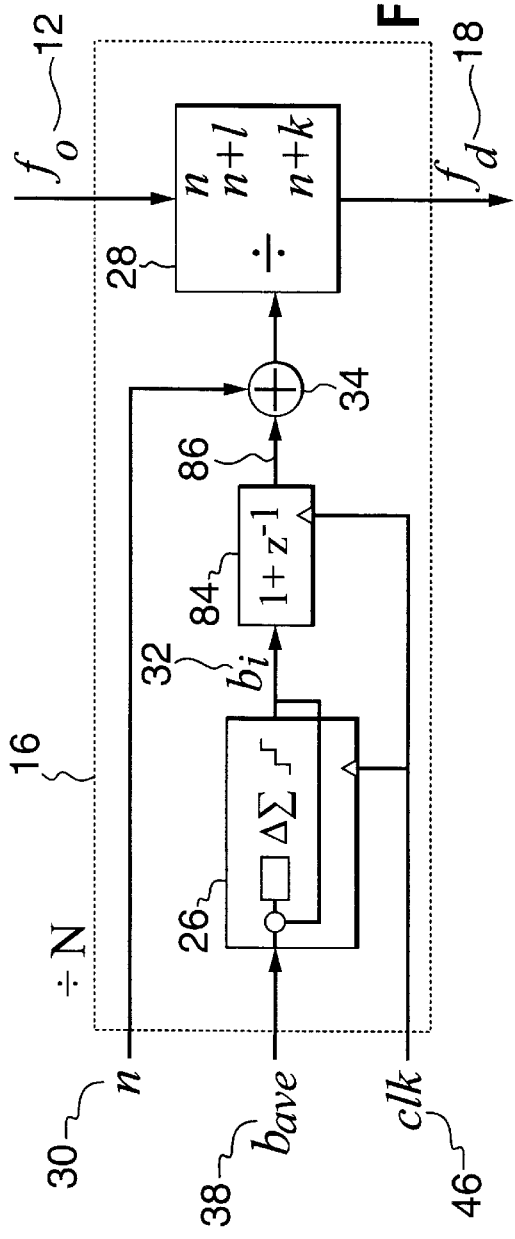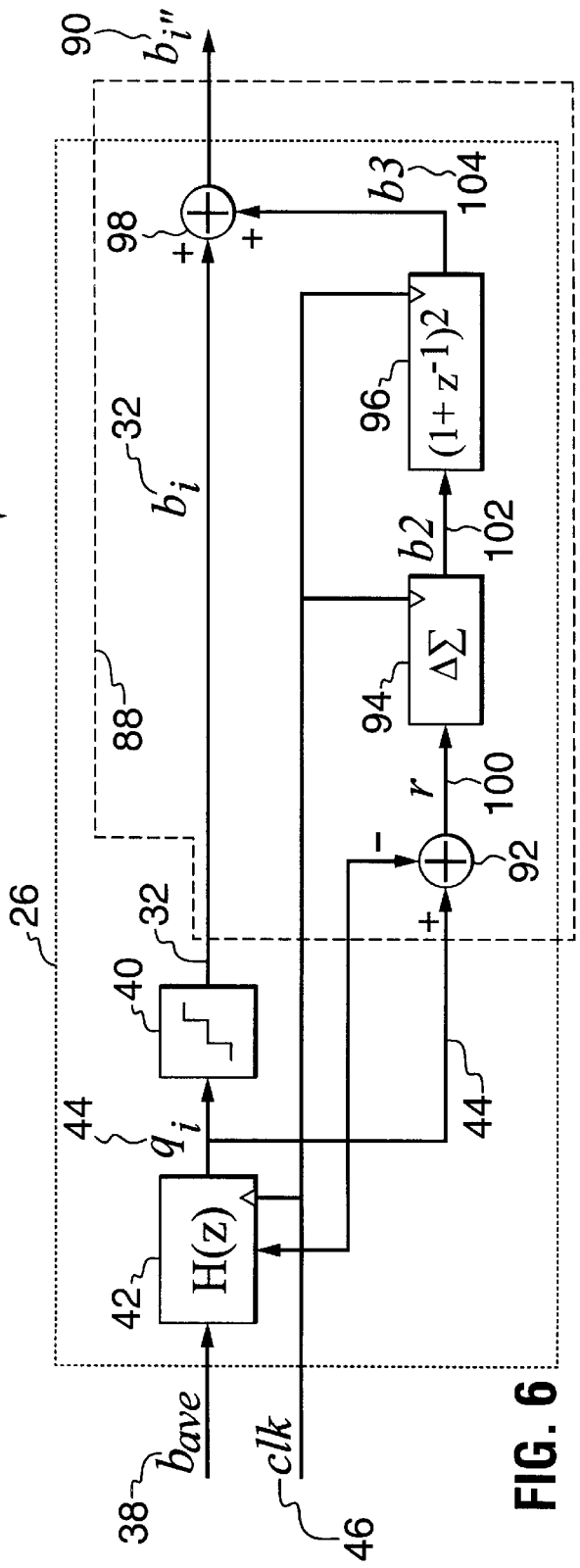

| Quantizer Input Value | 2's Compliment Output Value |
|---|---|
| 011xxxxxxxxx | 01 |
| 010xxxxxxxxx | 01 |
| 001xxxxxxxxx | 01 |
| 000xxxxxxxxx | 00 |
| 111xxxxxxxxx | 00 |
| 110xxxxxxxxx | 11 |
| 101xxxxxxxxx | 11 |
| 100xxxxxxxxx | 11 |

FIG. 7

FRACTIONAL-N DIVIDER USING A DELTA-SIGMA MODULATOR

FIELD OF THE INVENTION

This invention relates generally to fractional-N dividers, and more specifically to delta-sigma modulators used in fractional-N dividers.

BACKGROUND

Fractional-N single-loop phase locked loop (PLL) synthesizers are often used for generating one frequency from a range of predetermined desirable frequencies. Typically this technique is performed for the purpose of transmitting or receiving a radio signal over one frequency channel of many possible allocations.

The structure of many fractional-N single-Loop PLL synthesizers is shown in FIG. 1. A voltage controlled oscillator (VCO) 10 provides an output signal 12, $f_o$ oscillating with a frequency responsive to a control signal 14, s2. A fractional-N divider 16 provides a divided signal 18, $f_d$, such that the frequency of $f_i$ is the frequency of f divided by some desired division ration, N. A phase detector 20 provides a signal 22, s1, such that the signal 22, s1, is proportional to the phase or frequency difference between $f_d$ and a reference frequency signal 24, $f_r$. A loop filter 26, F(s), provides the control signal 14, s2 so that the overall loop is a stable phase locked loop.

The output frequency 12, $f_o$ of such a synthesizer depends on the reference frequency 24, $f_r$, and the desired division ration, N. Specifically, $f_o = Nf_r$.

Often a component of the fractional-N divider 16 is a delta-sigma modulator 26. In delta-sigma controlled synthesizers, the value of N can take on fractional values. Typically, this is provided by a programable divider 28, responsive to some programmed base value 30, n, and a first low resolution digital word 32, $b_i$, of the delta-sigma modulator 26. A first summer 34 provides a control signal 36, c, such that the programmable divider 28 divides by predetermined ratios n, n+1, n+2, . . . n+k; where k is some predetermined integer which depends on the particular delta-sigma modulator 26 used. Various other means, known to those versed in the art, may be provided such that the delta-sigma modulator 26 selects one of the predetermined division ratios for each cycle of the programable divider 28.

Thus, if the delta-sigma modulator 26 has a fixed-point binary input 38, $b_{ave}$, first low resolution digital word, 32, $b_i$, for each cycle of the programmable divider 28, there is some time average value for this such that $b_i = b_{ave} + Q_i$ where $b_{ave}$ is the desired, fractional, average output and $Q_i$ is the quantization error for each cycle of the programmable divider 28. Since $b_{ave}$ is a long term average of many integers, it can have a fractional value and fractional-N division may be achieved.

In the short term, there is often an non-zero quantization error. A delta-sigma modulator 26 is defined herein by the ability to shape the spectral density of this quantization error. The noise shaping provided by the delta-sigma modulator 26 is such that the quantization error is reduced at and near to a frequency substantially equal to zero, the reference frequency 24, $f_r$, and all multiples the reference frequency 24, $f_r$.

This error shaping allows the quantization error to be substantially removed by the low pass filtering of the closed-loop PLL.

Although all delta-sigma modulators have the same functional definition, some delta-sigma modulators perform better than others in the ability to randomize and noise shape the quantization error. Some specific limitations are as follows.

With an input signal with a frequency substantially equal to zero, any digital delta-sigma modulator becomes a finite state machine. A delta-sigma modulator which has a longer sequence length, which in turn produces more spurious signals, will generally have less power in each individual spurious signal. The power in each of these spurious signals can presently limit the performance of a delta-sigma modulator based fractional-N synthesizer, especially when it is desirable to reduce the number of bits in the delta-sigma modulator. This creates difficulty in designing low power synthesizers with low spurious signals.

Another factor which limits the performance of delta-sigma modulator based fractional-N synthesizers is high frequency spurious signals outside the loop bandwidth of the PLL synthesizer. When these spurious signals are substantially larger than those produced by sequence length limits, any nonlinearity substantially equivalent to a phase detector nonlinearity can mix these spurious signals to new frequencies within the bandwidth of the PLL. These spurious signals often can not be filtered out by the loop filter.

Further, different delta-sigma modulators involve different amounts of digital hardware. In an large scale integration implementation, this hardware consumes silicon area and power, both of which are disadvantageous for low cost portable equipment.

For the foregoing reasons, there is a need to provide a fractional-N divider which uses a delta-sigma modulator with reduced spurious signals.

SUMMARY

The present invention s directed to a fractional-N divider which uses a delta-sigma modulator to provide reduced spurious signals.

The present invention provides a delta-sigma modulator for use in a fractional-N frequency divider, the delta-sigma modulator comprising a dead zone quantizer and an error shaping filter. The dead zone quantizer responds to a high resolution digital word. The dead zone quantizer provides a first low resolution digital word. The error shaping filter responds to a fixed-point binary input signal, the first low resolution digital word and a clock signal. The error shaping filter provides the high resolution digital word.

An advantage of the present invention is reduced spurious signals, and thus improved fractional-N divider performance.

BRIEF DESCRIPTION OF THE DRAWINGS

These and other features, aspects, and advantages of the present invention will become more apparent from the following description, appended claims, and accompanying drawings where:

FIG. 5 illustrates a fractional-N divider with contiguous tuning across integer-N boundaries according to an optional aspect of the invention;

FIG. 6 illustrates a higher order delta-sigma modulator according to an optional aspect of the invention; and FIG. 7 illustrates, by example, the input and output values for a dead zone quantizer according to an embodiment of the invention.

DETAILED DESCRIPTION

By way of overview, this description is presented as follows. First, the structure of the fractional-N divider is described. Second, the operation of the fractional-N divider is described. Third, the advantages of the fractional-N divider are described.

Figure 1:
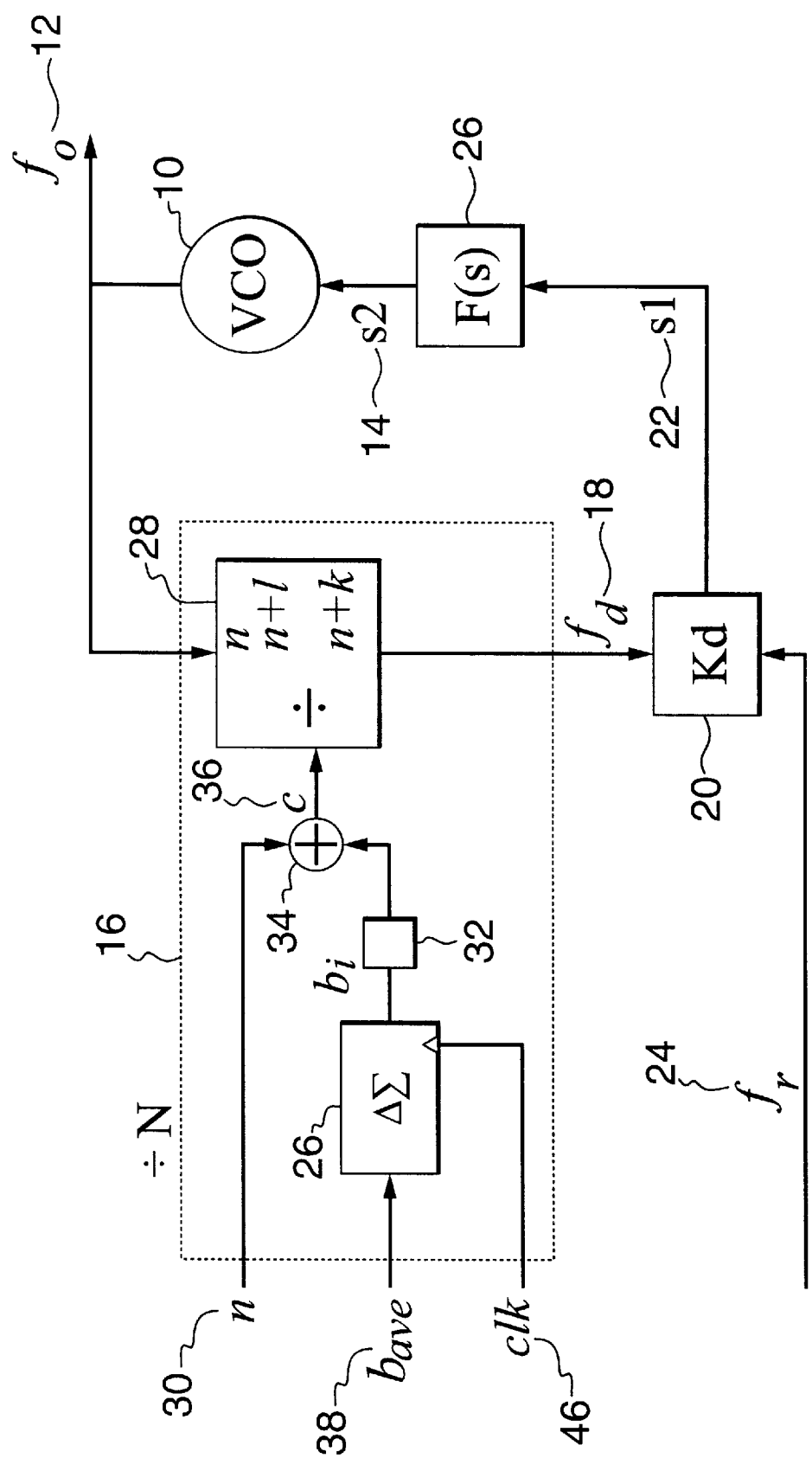
FIG. 1 illustrates in block diagram form, the general architecture of a single-loop delta-sigma fractional-N synthesizer.
Figure 2:
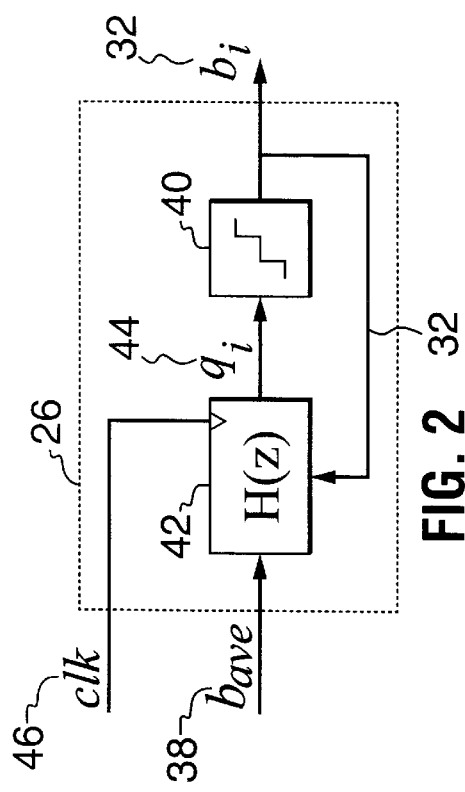
FIG. 2 illustrates in block diagram form, an embodiment of a delta-sigma modulator in accordance with the present invention.

FIG. 1 illustrates a fractional-N divider 16 for use in a fractional-N frequency synthesizer. FIG. 2 illustrates the structure of the delta-sigma modulator 26 of FIG. 1 in accordance with the invention. Thus, the fractional-N divider 16 comprises a dead zone quantizer 40, an error shaping filter 42, a first summer 34 and a programmable divider 28. The dead zone quantizer 40 responds to a high resolution digital word 44. The dead zone quantizer 40 provides a first low resolution digital word 32. The error shaping filter 42 responds to a fixed-point binary input signal 38, the first low resolution digital word 32 and a clock signal 46. The error shaping filter 42 provides the high resolution digital word 44. The first summer 34 responds to the first low resolution digital word 32 and a programmed base value 30. The first summer 34 provides a control signal 36. The programmable divider 28 responds to a synthesizer output signal 12 and the control signal 36. The programmable divider 28 provides a divided signal 18.

Figure 3:
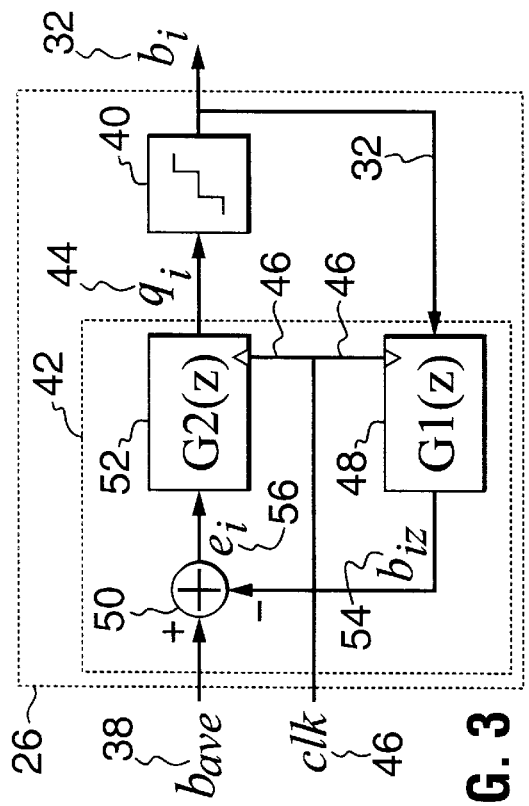
FIG. 3 illustrates a single loop feedback delta-sigma modulator with an error shaping filter according to a further embodiment of the invention.

Turning now to FIG. 3, an optional embodiment of the error shaping filter 42 is shown. The error shaping filter 42 comprises a first filter 48, a second summer 50 and a second filter 52. The first filter responds to the first low resolution digital word 32 and a clock signal 46. The first filter 48 provides a loop stabilizing signal 54. The second summer 50 responds to the fixed-point binary input 38 and the loop stabilizing signal 54. The second summer 50 provides a difference signal 56 proportional to the difference between the fixed-point binary input 38 and the loop stabilizing signal 54. The second filter 52 responds to the difference signal 56 and a clock signal 46. The second filter 52 provides the first low resolution digital word 32.

Figure 4:
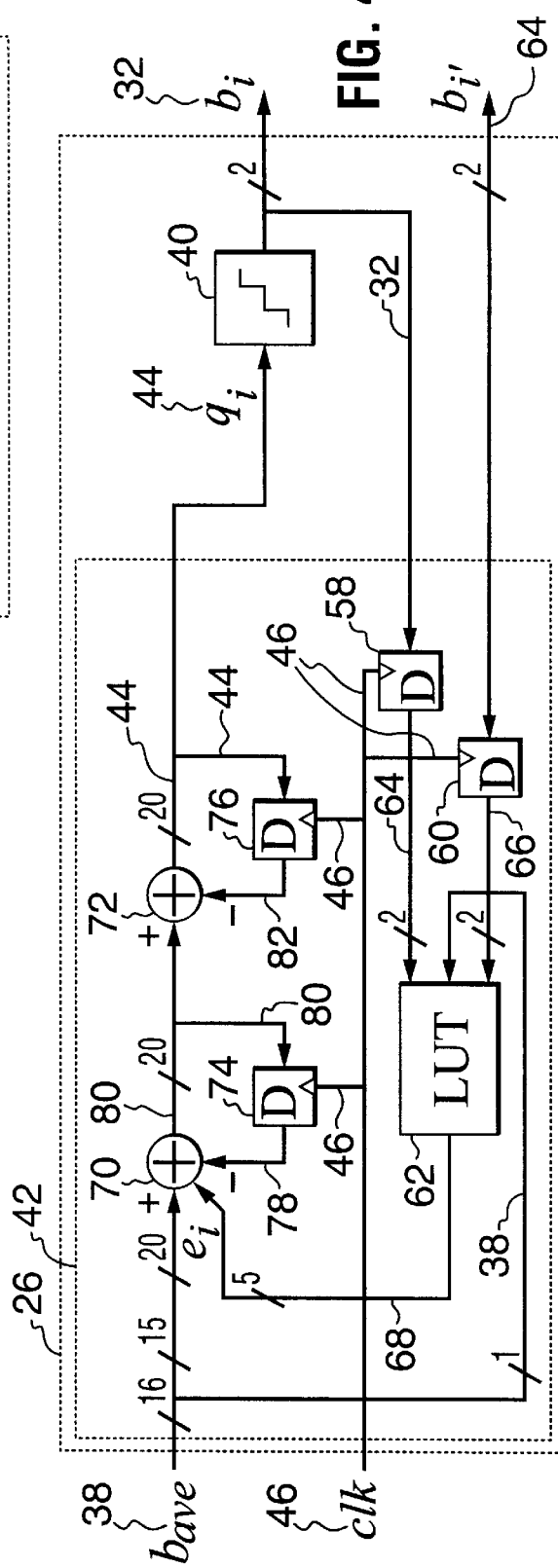
FIG. 4 illustrates a single loop feedback second order delta-sigma modulator according to an optional aspect of the invention.

In FIG. 4 an optional embodiment of the error shaping filter 42 is shown. The first filter 48 of FIG. 3 comprises a first storage register 58, a second storage register 60 and a lookup table 62. The first storage register 58 responds to the first low resolution digital word 32 and the clock signal 46. The first storage register 58 provides a first lookup table input signal 64. The second storage register 60 responds to the first lookup table input signal 64 and the clock signal 46. The second storage register 60 provides a second lookup table input signal 66. The lookup table 62 responds to the first lookup table input signal 64, the second lookup table input signal 66 and the most significant bit of the fixed point binary input 38. The lookup table 62 provides a lookup table output signal 68. Furthermore, the second filter 52 of FIG. 3 comprises a first digital adder 70, a second digital adder 72, a third register 74 and a fourth register 76. The first digital adder 70 responds to the lookup table output signal 68, the fixed point binary input 38 and a third register output signal 78. The first digital adder 70 provides a first digital adder output signal 80. The second digital adder 72 responds to the first digital adder output signal 80 and a fourth register output signal 82. The second digital adder 72 provides the high resolution digital word 44. The third register 74 responds to the clock signal 46 and the first digital adder output signal 80. The third register 74 provides the third register output signal 78. The fourth register 76 responds to the clock 46 and the high resolution digital word 44. The fourth register 76 provides the fourth register output signal 82.

In the optional embodiment of the invention shown in FIG. 5, the fractional-N divider 16 further comprises a filter 84 for contiguous tuning means. The filter 84 responds to the first low resolution digital word 32 and the clock signal 46. The filter 84 provides a filtered first low resolution digital word 86. Also, in this embodiment, the first summer 34 responds to the filtered first low resolution digital word 86.

In the optional embodiment of the invention shown in FIG. 6, the fractional-N divider 16 further comprises a residual error compensator 88. The residual error compensator 88 responds to the first low resolution digital word 32, the clock signal 46 and the high resolution digital word 44. The residual error compensator 88 provides a higher order, noise shaped first low resolution digital word 90.

In FIG. 6, the residual error compensator 88 comprises a third summer 92, a second delta-sigma modulator 94, a fourth filter 96 and a fourth summer 98. The third summer 92 responds to the high resolution digital word 44 and the first low resolution digital word 32. Third summer 92 provides an error signal 100 proportional to the difference between the high resolution digital 44 and the first low resolution digital word 32. The second delta-sigma modulator 94 responds to the error signal 100 and the clock signal 46. The second delta-sigma modulator 94 provides a second low resolution digital word 102. The fourth filter 96 responds to the second low resolution digital word 102 and the clock signal 46. The fourth filter 96 provides a filtered second low resolution digital word 104. The fourth summer 98 responds to the filtered second low resolution digital word 104 and the first low resolution digital word 32. The fourth summer 98 provides a higher order, noise shaped first low resolution digital word 90.

The operation of the invention is now described. FIG. 2 illustrates the delta-sigma modulator 16 comprising the dead-zone quantizer 40 and the error shaping filter 42. The error shaping filter 42 is clocked by the clock signal 46, $clk$, which is periodic at the frequency of the reference 24. The dead-zone quantizer 40 provides quantization of the high resolution digital 44/$q_i$. A dead zone quantizer is a quantizer with 3 or a higher odd number of possible output levels and with an output of 0 for an input near the centre of the normal input range. This provides different quantization error than a slicer or single bit quantizer.

FIG. 7 illustrates by example, the input and output values for a 3 level dead zone quantizer 40 with two's compliment binary encoding of the numerical values. In this example the output values are −1,0 and +1. Other numbers of output levels are also possible. Bit positions marked with an x in FIG. 7 are don't cares and hence the output value is a logic function of the three most significant bits of the input value. Extra most significant bits may be added as necessary by sign extending the quantizer 40 input value to provide sufficient dynamic range for the variations in signal magnitude in each of the accumulators, or resonators, prior to the quantizer 40.

The error shaping digital filter 42 clock at the frequency of the reference 24, $f_r$, provides spectral shaping of the quantization error introduced by the dead-zone quantizer 40 and a stable delta-sigma modulator. Many stable delta-sigma modulators have been presented in the literature and are known to those versed in the art. The presently known and understood stability analysis techniques apply equally well to the invention as well as prior art delta-sigma modulators. These techniques are described in Delta-Sigma Data Converters: Theory Design and Simulation (Norsworthy et al.) included herein by reference. The error shaping filter 42 is responsive to both the fixed-point binary input signal 38 $b_{ave}$ and the quantizer output value, the first low resolution digital word 32, $b_i$ such that the overall delta-sigma modulator provides a low pass or substantially all pass filter from $b_{ave}$ to $b_i$, and a notch filter to reduce the spectral density of the quantization error at a frequency substantially equal to zero and multiples of the clock frequency.

As with single bit quantizers or multibit quantizers, described in the prior art, the error shaping filter 42 must provide negative feedback and a stable feedback loop to control the quantization error. The feedback is accomplished by the input of the first low resolution digital word 32 to the error shaping filter 42.

To further clarify without reducing generality, one particular example illustrated in FIG. 3 teaches that, according to an optional aspect of the invention, the first filter 48 G1(z) provides a Stabilizing-Zero transfer function. The Stabilizing-Zero transfer function is $K[1-(1-z^{-1})^P]$. In the forgoing equation P is the order of the delta-sigma modulator 16 and the number of accumulators in the feed-forward path, and K is 2 raised to the power of an integer number.

Alternatively, the transfer function of the first filter 48 G1(z) may be a constant, with the stabilizing zeros included in the second filter 52.

The second filter 52 G2(z), with substantial gain at or near a frequency substantially equal to zero and multiples of the reference frequency 24, provides the quantizer input value for the dead-zone quantizer 40.

Typically, the second filter 52 G2(z) is an all pole filter with poles at a frequency substantially equal to zero. In this case, the second filter 52 is provided by two or more accumulators. To position quantization error noise notches at other frequencies, the second filter 52 could include a series of resonators and/or accumulators to move the poles of G2(z) to frequencies higher than zero.

Another embodiment the invention provides the first filter 48 of this type, with coefficients that are all even powers of two.

The error shaping filter 42 of FIG. 4 teaches by examples an optional aspect of the invention which is the employment of the error shaping filter 42 which has a regular layout and minimal hardware when implemented in an large scale integration circuit. The first storage register 58 stores the previous value of the quantizer output, the first low resolution digital word 32 $b_i$, and provides the delayed version of the output 64, $b_i'$. The second storage register 60 stores the delayed version of the output 64, $b_i'$, and provides a twice delayed version of the quantizer output 66, $b_i''$. The lookup table 62 stores and provides precomputed differences 68, $e_i$, selected by the first filter 48 function G1(z) AND the fixed-point binary input 38 $b_{ave}$. A first accumulator comprises a digital adder 70 and register 74 and provides an accumulated output 80, $a_i$. A second accumulator comprises a digital adder 72 and register 76 and provides the input, the high resolution digital word 44 to the dead-zone quantizer 40. The accumulators are also known as integrators.

The transfer function is of the error shaping filter 42 may be $-[(1-z^{-1})^2-1]K$ where K is as previously defined and $z^{-1}$ is the delay operator.

It will be clear to those versed in the art of digital electronics, that the resolution of the delta-sigma modulator can be increased by one or more bits by increasing the bus widths of the input and the accumulators in the path of the second filter 52. Similarly, the resolution of the delta-sigma modulator can be decreased by one or more bits by decreasing the bus widths of the input and the accumulators in the path of the second filter 52.

It will be clear to those versed in the art of digital electronics, that other forms of digital logic could replace the lookup table with equivalent functionality. In general, the minimal hardware and regular layout are provided by the single loop feed-back and power of two scaling factors in the feed-back filter.

For higher order delta-sigma modulators, the two integrators of FIG. 4 may be generalized to two or more integrators and the two delays of the output, the first low resolution signal 32 $b_i$, can be generalized to two or more delays.

In some cases, it may be desirable to use the output 64 $b_i'$ rather than the first low resolution digital word 32 $b_i$ as the delta-sigma modulator 16 output. The output 64 $b_i'$ provides a delayed and resynchronized output. $b_i'$ 64 can be regarded as equivalent to the first low resolution digital word 32 $b_i$ once this delay is taken into account.

The previously described embodiments of the present invention have many advantages, including the following. The embodiments described above reduce the performance degrading effects of spurious signals within the loop bandwidth of the fractional-N frequency sysnthesizer. This reduction is accomplished by one of two advantages, or both. Firstly, spurious signals occurring within the loop bandwidth are reduced. Second, spurious signals occurring outside the loop bandwidth are reduced, so that when these out of band spurious signals are mixed into the loop bandwidth by nonlinearities, the resulting inband spurious signals are reduced.

A further advantage the embodiment shown in FIG. 4 above is an error shaping filter with reduced hardware and regular layout when implemented in a large scale integration circuit.

Further examples and embodiments of the invention are now outlined. FIG. 5 teaches by example an apparatus for obtaining contiguous tuning without having excessively large values in the accumulators. A filter 82, responsive to the delta-sigma output, the first low resolution digital word 32 $b_i$, provides an output signal, the filtered first low resolution digital word 86 c', which controls the divide ratio of the programmable divider 28. The filter 82 provides a fixed gain at a frequency substantially equal to zero, $k_{filter}$, greater than 1. This gain is provided such that the fixed point binary input 38 $b_{ave}$, which varies over a range from $b_{ave}$=a to $b_{ave}$=a+1/$K_{filter}$, and provided a corresponding filtered low resolution digital word 86 c', which varies over a range from $aK_{filter}$ to $aK_{filter}$+1.

Optionally, changing the programmable base value 30, n, provides a frequency synthesizer tuning range which can be contiguously tuned across integer-n boundaries.

In the example of FIG. 5, the filter 82 adds the present output of the delta-sigma modulator 16 to the previous output of the delta-sigma modulator 16 provides a gain of two at a frequency substantially equal to zero. As a result, varying the component at a frequency substantially equal to zero of the first low resolution digital word 32 $b_i$ over a range from −0.25 to +0.25 causes the component at a frequency substantially equal to zero of the filtered first low resolution signal 86 to vary over a range from −0.5 to +0.5.

FIG. 6 illustrates an apparatus for compensating residual error of the dead-zone quantizer 40 which is not completely removed by the error shaping filter 42. The third summer 92 detects the residual error and provides an error signal 100, r, corresponding to the error introduced by the dead-zone quantizer 40. The delta-sigma modulator 94 responds to the error signal 100 r, and the clock signal 46 clk. The delta-sigma modulator 94 provides the second low resolution digital word 102 b2, such that b2 102 represents the error signal 100, r. The quantization error introduced by the delta-sigma modulator 16 is reduced at or near a frequency substantially equal to zero and all multiples of the frequency of the clock signal 46 clk. The fourth filter responsive to the second low resolution digital word 102 and clock signal 46, clk, providing signal filtered second low resolution signal 104 b3, such that the transfer function provided for b3 from b2 is $(1-z^{-1})^2$. The fourth summer 98 responds to filtered second low resolution signal 104 b3, and the first low resolution digital word 32 $b_i$.

Although the present invention has been described in considerable detail with reference to certain preferred versions thereof, other versions are possible. Therefore, the spirt and scope of the appended claims should not be limited to the description of the preferred versions contained herein.

What is claimed is:

1. A fractional-N divider for use in a fractional-N frequency synthesizer, the fractional-N divider comprising:
    a. a dead zone quantizer, the dead zone quantizer responding to a high resolution digital word and the dead zone quantizer providing a first low resolution digital word;
    b. an error shaping filter, the error shaping filter responding to a fixed-point binary input signal, the first low resolution digital word and a clock signal and the error shaping filter providing the high resolution digital word;
    c. a first summer, the first summer responding to the first low resolution digital word and a programmed base value and the first summer providing a control signal; and
    d. a programmable divider, the programmable divider responding to a synthesizer output signal and the control signal and the programmable divider providing a divided signal.

2. A fractional-N divider as recited in claim 1, further comprising:
    1. a filter for contiguous tuning means, the filter responding to the first low resolution digital word and the clock signal and the filter providing a filtered first low resolution digital word; and
    2. wherein the first summer is responding to the filtered first low resolution digital word.

3. A fractional-N divider as recited in claim 1, the fractional-N divider further comprising:
    a. a residual error compensator, the residual error compensator responding to the first low resolution digital word and the clock signal and the high resolution digital word and the residual error compensator providing a higher order, noise shaped first low resolution digital word.

4. A fractional-N divider as recited in claim 3 wherein the residual error compensator comprises:
    a. a third summer, the third summer responding to the high resolution digital word and the first low resolution digital word and the third summer providing an error signal proportional to the difference between the high resolution digital word and the first low resolution digital word;
    b. a delta-sigma modulator, the delta-sigma modulator responding to the error signal and the clock signal and the delta-sigma modulator providing a second low resolution digital word;
    c. a fourth filter, the fourth filter responding to the second low resolution digital word and the clock signal and the fourth filter providing a filtered second low resolution digital word; and
    d. a fourth summer, the fourth summer responding to the filtered second low resolution digital word and the first low resolution digital word and the fourth summer providing the higher order, noise shaped first low resolution digital word.

5. A fractional-N divider as recited in claim 1, wherein the error shaping filter comprises:
    a. a first filter, the first filter responding to the first low resolution digital word and the clock signal and the first filter providing a loop stabilizing signal;
    b. a second summer, the second summer responding to the fixed-point binary input and the loop stabilizing signal and the second summer providing a difference signal proportional to the difference between the fixed-point binary input and the loop stabilizing signal; and
    c. a second filter, the second filter responding to the difference signal and the clock signal and the second filter providing the high resolution digital word.

6. A fractional-N divider as recited in claim 5, wherein the second filter provides a Stabilizing-Zero transfer function.

7. A fractional-N divider as recited in claim 5, wherein the second filter provides a constant transfer function.

8. A fractional-N divider as recited in claim 5, wherein the first filter comprises:
    a. a first storage register, the first storage register responding to the first low resolution digital word and the clock signal and the first storage register providing a first lookup table input signal;
    b. a second storage register, the second storage register responding to the first lookup table input signal and the clock signal and the second storage register providing a second lookup table input signal; and
    c. a lookup table, the lookup table responding to the first lookup table input signal, the second lookup table signal and the fixed point binary input and the lookup table providing a lookup table output signal.

9. A fractional-N divider as recited in claim 5, wherein the second filter is an all pole filter with poles at a frequency substantially equal to zero.

10. A fractional-N divider as recited in claim 5, wherein the second filter has poles at frequencies higher than zero.

11. A fractional-N divider as recited in claim 5, wherein the second filter comprises:
    a. a first digital adder, the first digital adder responding to the lookup table output signal, the fixed point binary input and a third register output signal and the first digital adder providing a first digital adder output signal;
    b. a second digital adder, the second digital adder responding to the first digital adder output signal and a fourth register output signal and the second digital adder providing the high resolution digital word;
    c. a third register, the third register responding to the clock signal and the first digital adder output signal and the third register providing the third register output signal; and
    d. a fourth register, the fourth register responding to the clock and the second digital adder output signal and the fourth register providing the second register output signal.

12. A fractional-N divider as recited in claim 5,
 a. wherein the first filter comprises:
  i. a first storage register, the first storage register responding to the first low resolution digital word and the clock signal and the first storage register providing a first lookup table input signal;
  ii. a second storage register, the second storage register responding to the first lookup table input signal and the clock signal and the second storage register providing a second lookup table input signal; and
  iii. a lookup table, the lookup table responding to the first lookup table input signal, the second lookup table signal and the fixed point binary input and the lookup table providing a lookup table output signal; and
 b. wherein a second filter comprises:
  i. a first digital adder, the first digital adder responding to the lookup table output signal, the fixed point binary input and a third register output signal and the first digital adder providing a first digital adder output signal;
  ii. a second digital adder, the second digital adder responding to the first digital adder output signal and a fourth register output signal and the second digital adder providing the high resolution digital word;
  iii. a third register, the third register responding to the clock signal and the first digital adder output signal and the third register providing the third register output signal; and
  iv. a fourth register, the fourth register responding to the clock and the second digital adder output signal and the fourth register providing the second register output signal.

13. A fractional-N divider for use in a fractional-N frequency synthesizer, the fractional-N divider comprising:
 a. a dead zone quantizer, the dead zone quantizer responding to a high resolution digital word and the dead zone quantizer providing a first low resolution digital word;
 b. an error shaping filter, the error shaping filter responding to a fixed-point binary input signal, the first low resolution digital word and a clock signal and the error shaping filter providing the high resolution digital word, wherein the error shaping filter comprises:
  i. a first filter, the first filter responding to the first low resolution digital word and the clock signal and the first filter providing a loop stabilizing signal, where in first filter comprises:
   (1) a first storage register, the first storage register responding to the first low resolution digital word and the clock signal and the first storage register providing a first lookup table input signal;
   (2) a second storage register, the second storage register responding to the first lookup table input signal and the clock signal and the second storage register providing a second lookup table input signal; and
   (3) a lookup table, the lookup table responding to the first lookup table input signal, the second lookup table signal and the fixed point binary input and the lookup table providing a lookup table output signal;
  ii. a second summer, the second summer responding to the fixed-point binary input and the loop stabilizing signal and the second summer providing a difference signal proportional to the difference between the fixed-point binary input and the loop stabilizing signal;
  iii. a second filter, the second filter responding to the difference signal and the clock signal and the second filter providing the high resolution digital word, wherein the second filter comprises:
   (1) a first digital adder, the first digital adder responding to the lookup table output signal, the fixed point binary input and a third register output signal and the first digital adder providing a first digital adder output signal;
   (2) a second digital adder, the second digital adder responding to the first digital adder output signal and a fourth register output signal and the second digital adder providing the high resolution digital word;
   (3) a third register, the third register responding to the clock signal and the first digital adder output signal and the third register providing the third register output signal; and
   (4) a fourth register, the fourth register responding to the clock and the second digital adder output signal and the fourth register providing the second register output signal;
 c. a programmable divider, the programmable divider responding to a synthesizer output signal and the control signal and the programmable divider providing a divided signal;
 d. a filter for contiguous tuning means, the filter responding to the first low resolution digital word and the clock signal and the filter providing a filtered first low resolution digital word;
 e. a first summer, the first summer responding to the filtered first low resolution digital word and a programmed base value and the first summer providing a control signal; and
 f. a residual error compensator, the residual error compensator responding to the first low resolution digital word and the high resolution digital word and the clock signal and the residual error compensator providing a higher order, noise shaped first low resolution digital word, wherein the residual error compensator comprises:
  i. a third summer, the third summer responding to the high resolution digital word and the first low resolution digital word and the third summer providing an error signal proportional to the difference between the high resolution digital word and the first low resolution digital word;
  ii. a delta-sigma modulator, the delta-sigma modulator responding to the error signal and the clock signal and the delta-sigma modulator providing a second low resolution digital word;
  iii. a fourth filter, the fourth filter responding to the second low resolution digital word and the clock signal and the fourth filter providing a filtered second low resolution digital word; and
  iv. a fourth summer, the fourth summer responding to the filtered second low resolution digital word and the first low resolution digital word and the fourth summer providing the higher order, noise shaped first low resolution digital word.

14. A delta-sigma modulator for use in a fractional-N frequency divider, the delta-sigma modulator comprising:
 a. a dead zone quantizer, the dead zone quantizer responding to a high resolution digital word and the dead zone quantizer providing a first low resolution digital word; and b. an error shaping filter, the error shaping filter responding to a fixed-point binary input signal, the first low resolution digital word and a clock signal and the error shaping filter providing the high resolution digital word.

15. A delta-sigma modulator as recited in claim 14, wherein the error shaping filter comprises:

a. a first filter, the first filter responding to the first low resolution digital word and the clock signal and the first filter providing a loop stabilizing signal;

b. a second summer, the second summer responding to the fixed-point binary input and the loop stabilizing signal and the second summer providing a difference signal proportional to the difference between the fixed-point binary input and the loop stabilizing signal; and c. a second filter, the second filter responding to the difference signal and the clock signal and the second filter providing the high resolution digital word.

16. A delta-sigma modulator as recited in claim 15, wherein the second filter provides a Stabilizing-Zero transfer function.

17. A delta-sigma modulator as recited in claim 15, wherein the second filter provides a constant transfer function.

18. A delta-sigma modulator as recited in claim 15, wherein the first filter comprises:

a. a first storage register, the first storage register responding to the first low resolution digital word and the clock signal and the first storage register providing a first lookup table input signal;

b. a second storage register, the second storage register responding to the first lookup table input signal and the clock signal and the second storage register providing a second lookup table input signal; and c. a lookup table, the lookup table responding to the first lookup table input signal, the second lookup table signal and the fixed point binary input and the lookup table providing a lookup table output signal.

19. A delta-sigma modulator as recited in claim 15, wherein the second filter is an all pole filter with poles at a frequency substantially equal to zero.

20. A delta-sigma modulator as recited in claim 15, wherein the second filter has poles at frequencies higher than zero.

21. A delta-sigma modulator as recited in claim 15, wherein the second filter comprises:

a. a first digital adder, the first digital adder responding to the lookup table output signal, the fixed point binary input and a third register output signal and the first digital adder providing a first digital adder output signal;

b. a second digital adder, the second digital adder responding to the first digital adder output signal and a fourth register output signal and the second digital adder providing the high resolution digital word;

c. a third register, the third register responding to the clock signal and the first digital adder output signal and the third register providing the third register output signal; and d. a fourth register, the fourth register responding to the clock and the second digital adder output signal and the fourth register providing the second register output signal.

22. A delta-sigma modulator as recited in claim 15, wherein:

a. a first storage register, the first storage register responding to the first low resolution digital word and the clock signal and the first storage register providing a first lookup table input signal;

b. a second storage register, the second storage register responding to the first lookup table input signal and the clock signal and the second storage register providing a second lookup table input signal;

c. a lookup table, the lookup table responding to the first lookup table input signal, the second lookup table signal and the fixed point binary input and the lookup table providing a lookup table output signal;

d. a first digital adder, the first digital adder responding to the lookup table output signal, the fixed point binary input and a third register output signal and the first digital adder providing a first digital adder output signal;

e. a second digital adder, the second digital adder responding to the first digital adder output signal and a fourth register output signal and the second digital adder providing the high resolution digital word;

f. a third register, the third register responding to the clock signal and the first digital adder output signal and the third register providing the third register output signal; and g. a fourth register, the fourth register responding to the clock and the second digital adder output signal and the fourth register providing the second register output signal.

* * * * *